(12) United States Patent
Ucer

(10) Patent No.: US 7,902,703 B2
(45) Date of Patent: Mar. 8, 2011

(54) APPARATUS AND METHOD FOR PRODUCING MECHANICAL WORK

(76) Inventor: Mustafa O. Ucer, Roseville, MN (US)

( * ) Notice: Subject to any disclaimer, the term of this patent is extended or adjusted under 35 U.S.C. 154(b) by 44 days.

(21) Appl. No.: 12/485,511

(22) Filed: Jun. 16, 2009

(65) Prior Publication Data
US 2009/0309428 A1 Dec. 17, 2009

Related U.S. Application Data

(63) Continuation-in-part of application No. 10/895,706, filed on Jul. 21, 2004, now Pat. No. 7,564,153.

(51) Int. Cl.
H02K 7/06 (2006.01)
(52) U.S. Cl. .......................................... 310/80
(58) Field of Classification Search .................. 310/80, 310/39, 36
See application file for complete search history.

(56) References Cited

U.S. PATENT DOCUMENTS

| | | | |
|---|---|---|---|
| 3,879,622 A | 4/1975 | Ecklin | |
| 3,967,146 A | 6/1976 | Howard | |
| 3,992,132 A | 11/1976 | Putt | |
| 4,048,548 A | 9/1977 | Nakajima et al. | |
| 4,179,633 A * | 12/1979 | Kelly | 310/80 |
| 4,267,647 A | 5/1981 | Anderson, Jr. et al. | |
| 4,300,067 A | 11/1981 | Schumann | |
| 5,017,819 A | 5/1991 | Patt et al. | |
| 5,179,305 A | 1/1993 | Van Engelen | |
| 5,418,414 A | 5/1995 | Ackermann et al. | |
| 5,432,382 A | 7/1995 | Pawlowski | |
| 5,446,319 A | 8/1995 | Pawlowski | |
| 5,548,177 A | 8/1996 | Carroll | |
| 5,582,846 A | 12/1996 | Cooper et al. | |
| 5,604,390 A | 2/1997 | Ackermann | |
| 5,962,944 A | 10/1999 | Narita et al. | |
| 6,084,322 A * | 7/2000 | Rounds | 310/46 |
| 6,400,046 B1 | 6/2002 | Hwang et al. | |
| 6,624,542 B1 | 9/2003 | Gabrys et al. | |
| 6,788,013 B2 | 9/2004 | Islam et al. | |
| 6,867,514 B2 * | 3/2005 | Fecera | 310/46 |
| 2004/0145263 A1 | 7/2004 | Kojima et al. | |

OTHER PUBLICATIONS

Introduction to Electrodynamics Third Edition, Davis J. Griffiths, 1999, Prentice Hall Inc., p. 207.

* cited by examiner

*Primary Examiner* — Nguyen N Hanh
(74) *Attorney, Agent, or Firm* — Patterson Thuente Christensen Pedersen, P.A.

(57) ABSTRACT

Improved energy conversion devices comprise a first ferromagnetic element, a second ferromagnetic element oriented such that similar poles of the first ferromagnetic element and the second ferromagnetic element can be positioned proximate each other, and a mechanical element connected to the first ferromagnetic element such that movement of the first ferromagnetic element can actuate the mechanical element to provide mechanical work. In some embodiments, the energy conversion devices can further comprise an externally powered temperature control device to selectively alter the temperature of the ferromagnetic elements to change the Curie temperature of the ferromagnetic elements. The change in temperature of the ferromagnetic elements and the orientation of the first and second ferromagnetic elements allows the repulsive force between the first and second ferromagnetic elements to result in mechanical work.

17 Claims, 8 Drawing Sheets

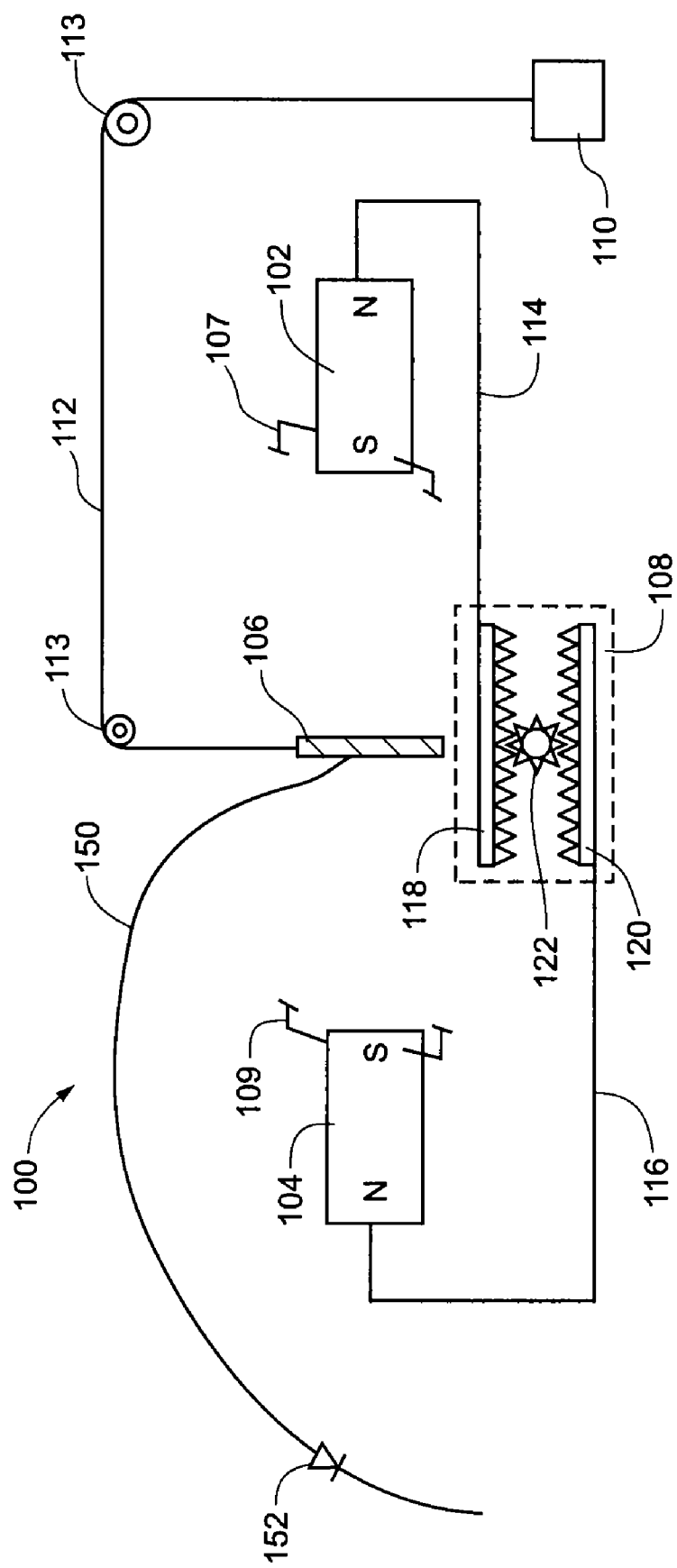

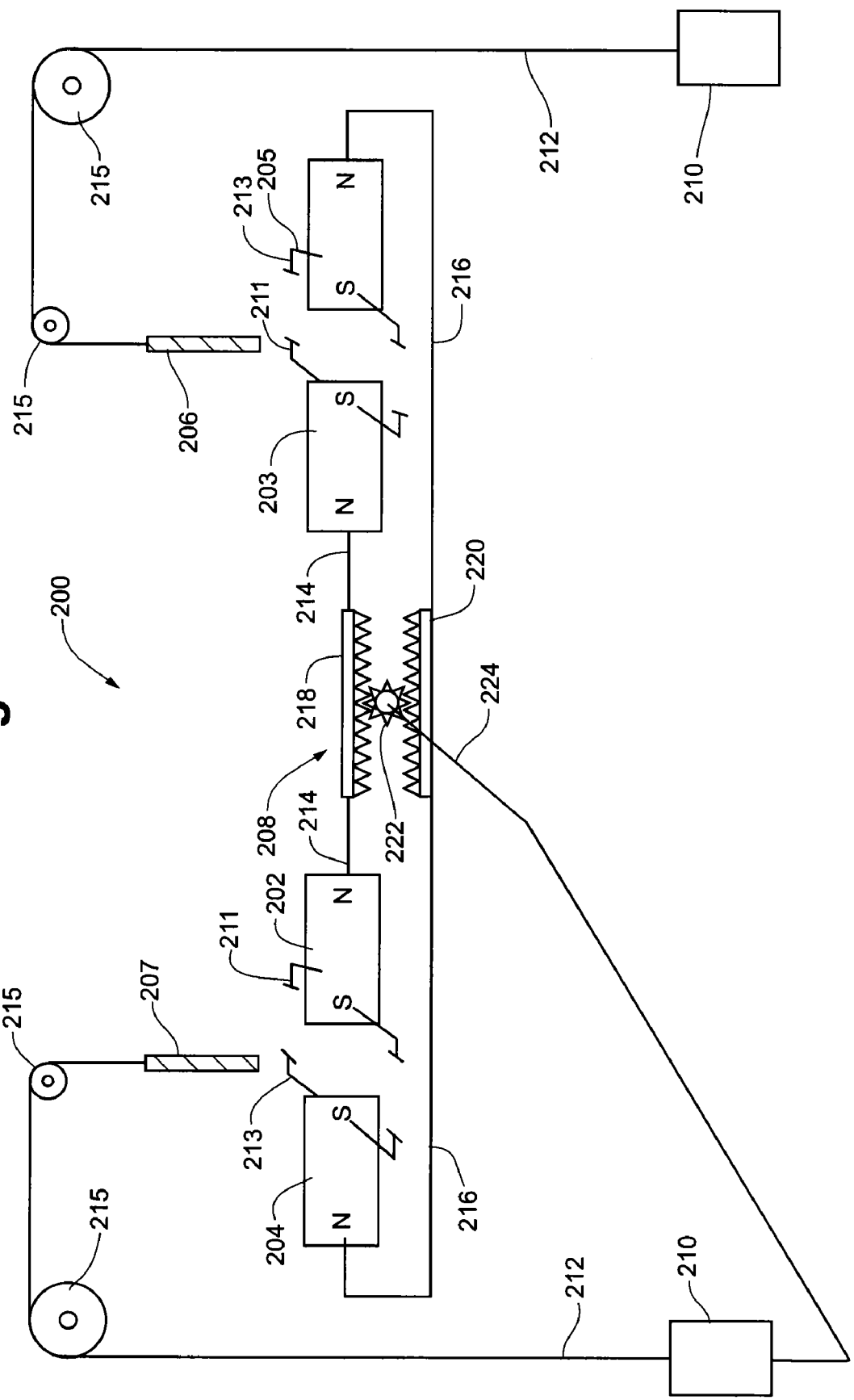

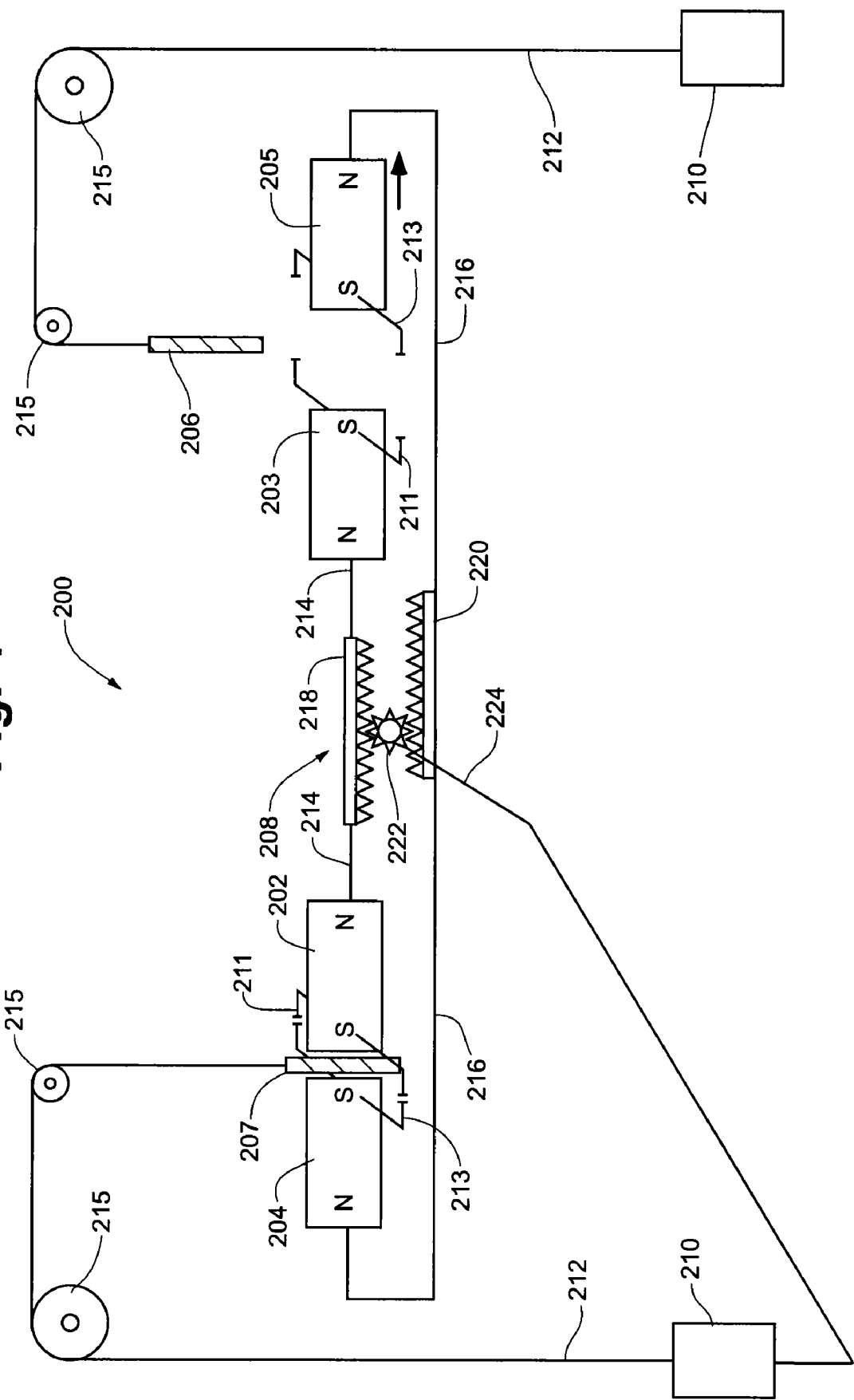

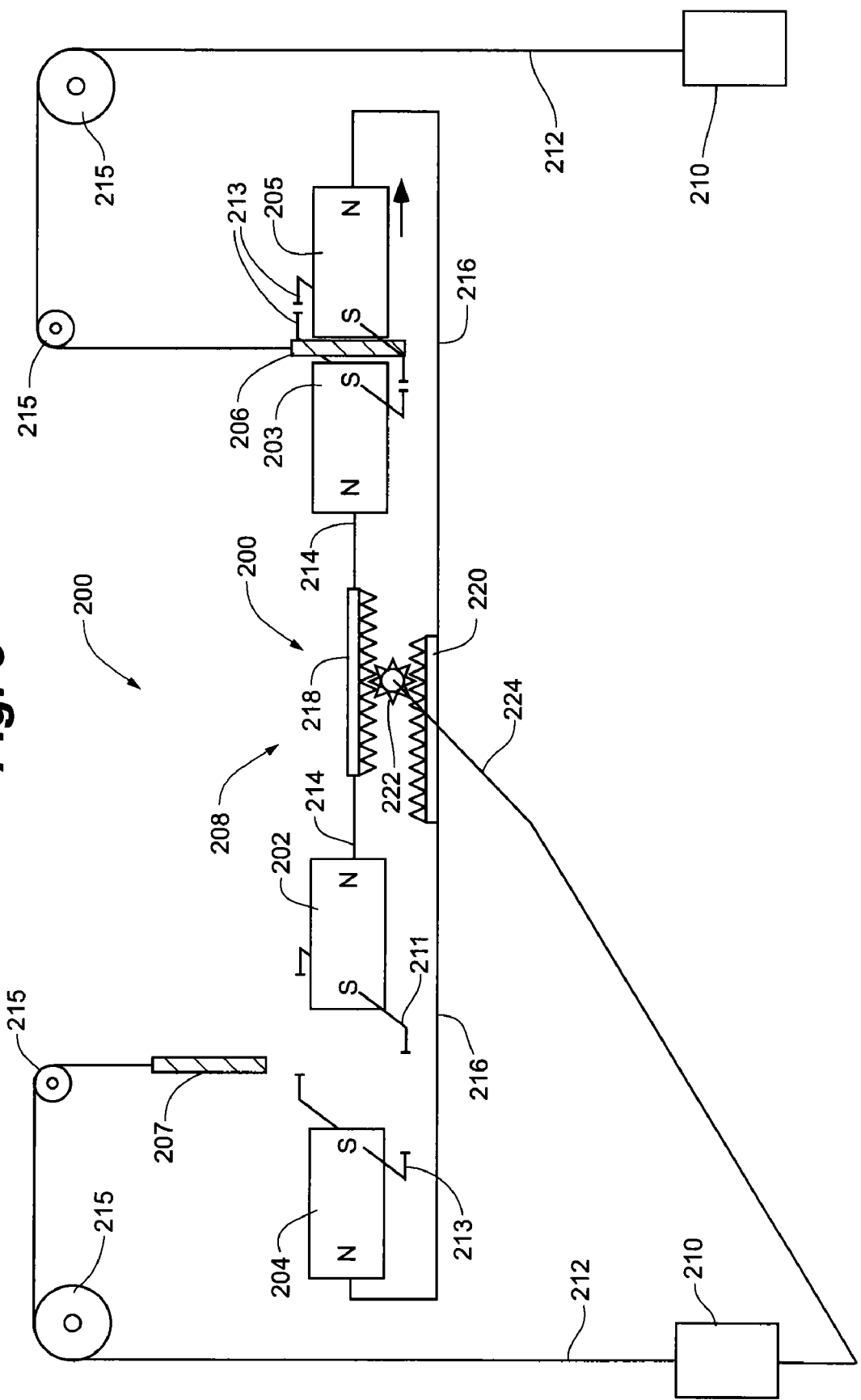

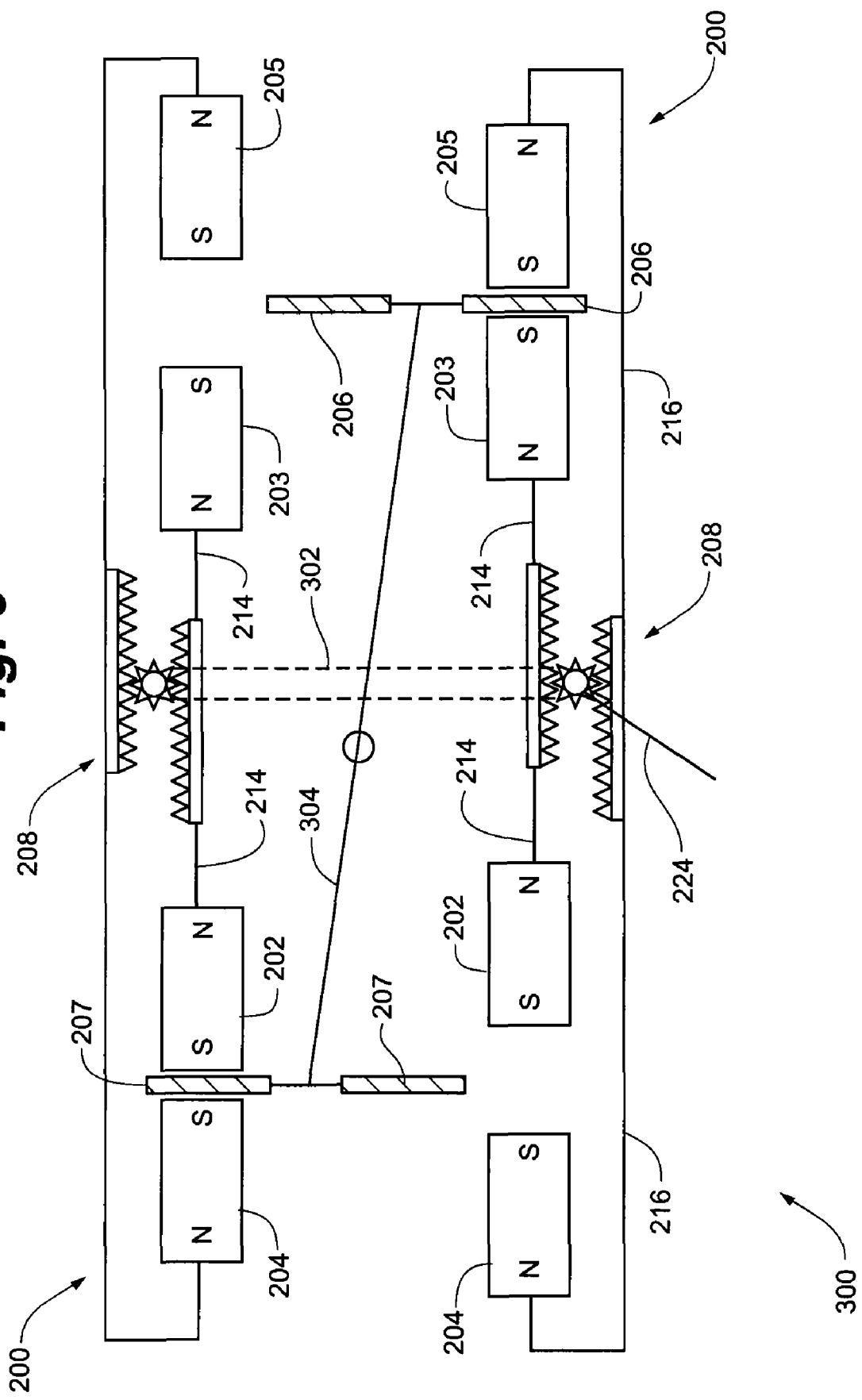

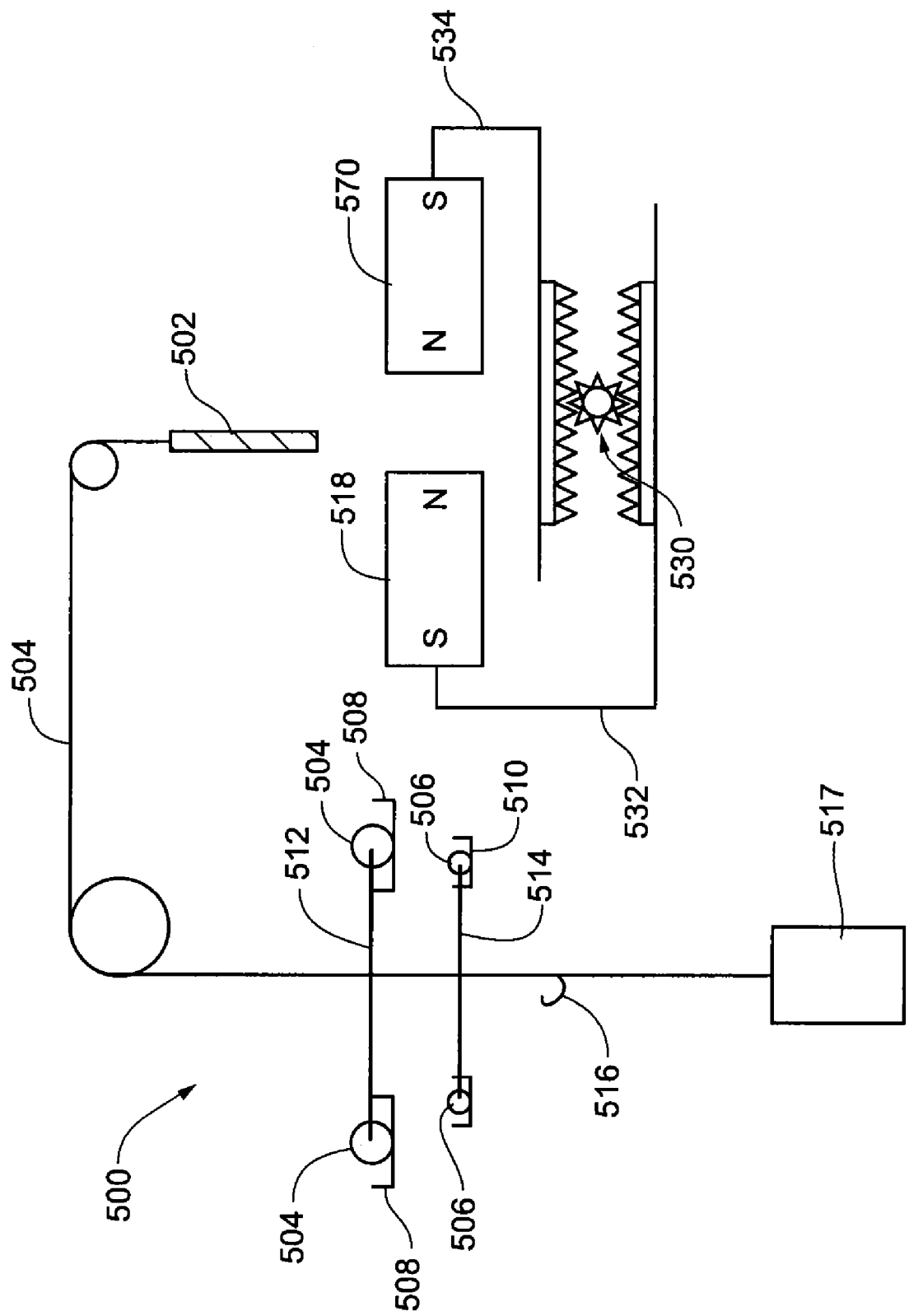

APPARATUS AND METHOD FOR PRODUCING MECHANICAL WORK

RELATED APPLICATION

This application is a continuation-in-part of application Ser. No. 10/895,706 filed Jul. 21, 2004, which is hereby fully incorporated herein by reference.

FIELD OF THE INVENTION

The invention pertains to energy conversion devices that can convert stored magnetic energy into mechanical work, and in particular to an apparatus comprising two or more magnets connected to a mechanical element such that movement of at least one of the magnets can actuate the mechanical element. In addition, the invention also pertains to methods of producing mechanical work.

BACKGROUND OF THE INVENTION

Modern societies depend on the generation of electricity to provide energy for powering electronic and/or mechanical devices, heating and/or cooling buildings, and numerous other applications. This reliance on electricity to cool homes and power electrical and/or mechanical devices has resulted in an increase in the combustion of fossil fuels such as coal. In addition, nuclear power plants have been increasingly used to produce electricity, and other types of combustion facilities such as, for example, tire burning plants have been proposed to meet the growing energy demands. Generally, the combustion of coal, and other fossil fuels, can result in large quantities of pollutants such as organic by-products and carbon monoxide being introduced into the atmosphere. Additionally, it is well known that spent nuclear fuel from nuclear power facilities can create environmental hazards that require expensive disposal procedures and equipment to store and dispose of nuclear waste.

Materials such as plastic and metals can be generally classified as ferromagnetic, paramagnetic or diamagnetic. For example, metals such as iron, cobalt, nickel and various alloys of these metals, are considered to be ferromagnetic. In general, ferromagnetic materials can become magnetized by subjecting the ferromagnetic material to an external magnetic field, which can be applied by another magnet and/or an electromagnet. Additionally, ferromagnetic materials can be influenced by an external magnet field such that ferromagnetic materials can be attracted to magnets. Paramagnetic materials such as, for example, aluminum, copper and gold, can be weakly influenced by a magnet, however, the attractive force of a paramagnetic material is typically unobservable without expensive monitoring equipment. Diamagnetic materials are generally all other materials that exhibit no measurable attraction or repulsion to the presence of an external magnetic field.

As noted above, magnets are materials that can attract, for example, ferromagnetic materials such as iron or cobalt. Moreover, the external magnetic field of a magnet can act upon ferromagnetic materials and cause unpaired electron spins to align in parallel, which creates a magnetic field around the ferromagnetic material. Furthermore, it is known that magnets can have a north pole and a south pole, and that the south pole of one magnet can be attracted to the north pole of an adjacent magnet. Additionally, it is also known that the similar poles of two magnets can repel each other, if the similar poles of the two magnets are located proximate one another.

SUMMARY OF THE INVENTION

In one aspect, the invention pertains to an energy conversion apparatus for producing mechanical work from stored magnetic energy comprising a first magnet having a north pole and a south pole and a second magnet having a north pole and a south pole, wherein the first magnet and the second magnet can be aligned such that the similar poles of the first and second magnet are adjacent each other. In these embodiments, the apparatus can further comprise a ferromagnetic element that can be selectively interposed between the first magnet and the second magnet. Additionally, the apparatus can also comprise a mechanical element connected to the first magnet such that movement of the first magnet can actuate the mechanical element.

In another aspect, the invention pertains to an energy conversion apparatus for producing mechanical work from stored magnetic energy comprising a plurality of first magnets having a north pole and a south pole, and a plurality of second magnets having a north pole and a south pole, wherein each of the plurality of first magnets can be associated with one of the plurality of second magnets such that a pole of each of the plurality of first magnets can be positioned proximate a similar pole of the associated second magnet. In these embodiments, the energy extraction apparatus can further comprise a plurality of ferromagnetic elements that can be selectively interposed between the plurality of first magnets and the plurality of second magnets. Additionally, a mechanical element can be connected to a portion of the plurality of first magnets such that movement of the plurality of first magnets can actuate the mechanical element.

In a further aspect, the invention pertains to a method of producing mechanical work comprising interposing a ferromagnetic element between a first magnet and a second magnet, wherein the first magnet and the second magnet are magnetically attracted to the ferromagnetic element and wherein the first magnet is connected to a mechanical element.

In another aspect, the invention pertains to an energy conversion apparatus for producing mechanical work from stored magnetic energy comprising a first magnet having a north pole and a south pole and a second magnet having a north pole and a south pole, wherein the first magnet and the second magnet are aligned such that the similar poles of the first and second magnet can be positioned adjacent each other. In these embodiments, the invention can further comprise a ferromagnetic element that can be selectively interposed between the first magnet and the second magnet, and a mechanical element connected to the first magnet such that movement of the first magnet can actuate the mechanical element, wherein a portion of the energy extracted by the apparatus can be used to selectively interpose the ferromagnetic element between the first magnet and the second magnet.

BRIEF DESCRIPTION OF THE DRAWINGS

FIG. 1 is a schematic diagram of an embodiment of an energy conversion apparatus comprising a first magnet, a second magnet and a ferromagnetic element that can be interposed between the first magnet and the second magnet.

FIG. 3 is a schematic diagram of an embodiment of an energy conversion apparatus comprising a plurality of first magnets, a plurality of second magnets and a plurality of ferromagnetic elements that can be interposed between the plurality of first magnets and the plurality of second magnets.

FIG. 4 is a schematic diagram of the apparatus of FIG. 3 showing the left ferromagnetic element interposed between a first magnet and a second magnet.

FIG. 5 is a schematic diagram of the apparatus of FIG. 3 showing the right ferromagnetic element interposed between a first magnet and a second magnet.

FIG. 6 is a schematic diagram of an embodiment of an energy conversion device comprising two of the devices shown in FIG. 3 coupled together.

FIG. 7 is a schematic diagram of an actuation device that can be employed in the energy devices of the present disclosure.

DETAILED DESCRIPTION OF THE INVENTION

Figure 1A:
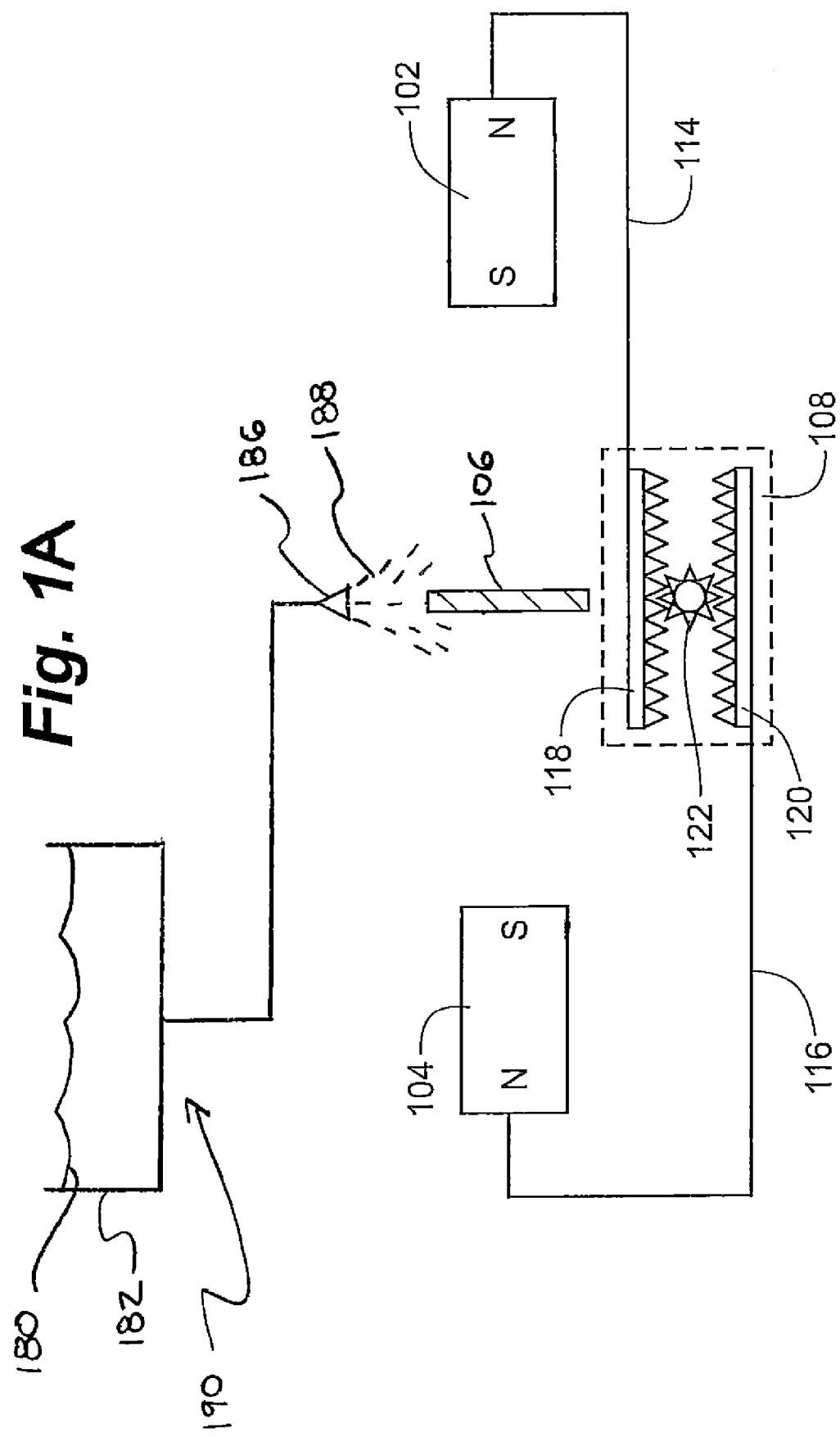
FIG. 1A is a schematic diagram of an embodiment of an energy conversion apparatus comprising a first ferromagnetic element, a second ferromagnetic element and an externally powered temperature control device to selectively alter the temperature of the ferromagnetic elements to change the Curie temperature of the ferromagnetic elements.

Improved energy conversion devices comprise a first magnet, a second magnet oriented such that similar poles of the first magnet and the second magnet can be positioned proximate each other, and a mechanical element connected to the first magnet such that movement of the first magnet can actuate the mechanical element to provide mechanical work. In some embodiments, the energy conversion devices can further comprise a ferromagnetic element that can be selectively interposed between the first magnet and the second magnet, which can facilitate movement of the first and second magnets towards the ferromagnetic element. Due to the orientation of the first and second magnets, and the associated mechanical element, the repulsive force between the first and second magnets can be converted into mechanical work. Additionally, the attractive force between the first and second magnets and the ferromagnetic element can also be converted into mechanical work. Converting these repulsive and attractive magnetic forces into mechanical work can provide a clean, environmentally friendly source of mechanical work that reduces or eliminates by-products such as carbon monoxide that can be associated with other energy sources. In one embodiment, the mechanical element can be connected to the first magnet, while in other embodiments the mechanical element can be connected to both the first magnet and the second magnet. In further embodiments, the improved energy conversion devices can comprise a plurality of first magnets and a plurality of second magnets, wherein the plurality of first and second magnets are oriented such that a pole of each first magnet can be associated with, and can be positioned proximate to, a similar pole of at least one second magnet.

As described above, magnets can attract and/or repel each other depending upon the orientation of the respective poles of each magnet. Similar poles of two magnets are known to repel each other, while opposite poles (i.e., north and south) are known to attract each other. Additionally, interposing a ferromagnetic material such as iron, nickel, or cobalt between two magnets whose similar poles are adjacent one another can reduce the repulsive force between the magnets, and can also cause the magnets to be attracted to the ferromagnetic material. Thus, interposing a ferromagnetic material between two magnets whose similar poles are adjacent one another can cause the two magnets to move towards the ferromagnetic material.

Modern society generally relies on numerous electrical and mechanical devices such as, for example, computers, power tools, microwaves, and the like, to perform daily functions. These electrical and mechanical devices typically require electricity to function, and therefore the increased reliance on electrical and mechanical devices has increased the demand for electricity production. As a result, increasing amounts of nuclear and fossil fuel are being consumed in order to satisfy the electricity demands of modern society. The increased consumption of nuclear and fossil fuels can create by-products such as carbon monoxide and nuclear waste that can be detrimental to the environment. Thus, it would be desirable to provide a device that could produce mechanical work and/or electricity that can also reduce or eliminate the production of environmentally detrimental by-products. As described herein, one way of producing mechanical work and/or electricity that can reduce production of environmentally dangerous by-products is to employ a device comprising two or more magnets that can be positioned in desired orientations relative to each other to produce mechanical work.

In general, the energy conversion devices of the present disclosure can produce mechanical work by movement of one or more magnets that are connected to a mechanical device such as a rack and pinion, drive shaft, or the like. In some embodiments, the energy devices of the present disclosure can comprise a first magnet and a second magnet oriented such that similar poles of the first and second magnet can be positioned proximate one another, and a mechanical element coupled to the first magnet, the second magnet or both. Additionally, the energy conversion devices of the present disclosure can further comprise a ferromagnetic element that can be selectively interposed between the first magnet and the second magnet, which can attract the first and second magnets towards the ferromagnetic element. As described below, actuation of the mechanical element can be provided by both the repulsion of the similar poles of the magnets, and also by the attraction of the magnets towards the ferromagnetic element. In other words, the energy devices can produce mechanical work in two cycles, the first cycle being the repulsion of two magnets whose similar poles are adjacent one another, and the second cycle being the attractive force of the two magnets towards a ferromagnetic element positioned between the two magnets.

In further embodiments, the energy conversion devices of the present disclosure can comprise a plurality of first magnets and a plurality of second magnets positioned such that a pole of each first magnet can be positioned proximate a similar pole of an adjacent second magnet, which can facilitate repulsion of the first magnets away form the second magnets. Additionally, a plurality of ferromagnetic elements can be provided such that each ferromagnetic element can be selectively interposed between adjacent first and second magnets, which can attract the adjacent first and second magnets towards the ferromagnetic element. Generally, a mechanical element can be connected to one or more of the first magnets and/or one or more of the second magnets such that movement of the first and/or second magnets can actuate the mechanical element and produce mechanical work.

Referring to FIG. 1, an embodiment of an energy conversion device 100 is shown comprising first magnet 102, second magnet 104, and ferromagnetic element 106 which can be selectively interposed between first magnet 102 and second magnet 104. Generally, first magnet 102 and second magnet 104 are oriented such that their similar poles are adjacent, which can facilitate repulsion between first magnet 102 and second magnet 104 when first magnet 102 and second magnet 104 are positioned proximate one another. In some embodiments, the south pole of the first magnet 102 can be oriented towards the south pole of the second magnet 104, while in other embodiments the north pole of the first magnet 102 can be oriented towards the north pole of the second magnet 104. Ferromagnetic element 106 can be connected to actuation device 110 via cable 112, which facilitates selectively interposing ferromagnetic element 106 in between first magnet 102 and second magnet 104. In some embodiments, cable 112 can be supported and guided by a pulley wheel system 113 or the like. In some embodiments, actuation device 110 can be a motor, a counter-balance system or combinations thereof. One of ordinary skill in the art will recognize that any mechanical system of selectively interposing ferromagnetic element 106 between first magnet 102 and second magnet 104 can be used as actuation device 110 of the present disclosure.

As described above, energy conversion device 100 can comprise ferromagnetic element 106, which can reduce the repulsive force between first magnet 102 and second magnet 104 and can facilitate moving magnets 102, 104 close together, when ferromagnetic element 106 is positioned between first magnet 102 and second magnet 104. Additionally, first magnet 102 and second magnet 104 can be attracted to the ferromagnetic element 106, which also facilitates moving first magnet 102 towards second magnet 104. In other words, ferromagnetic element 106 can facilitate re-cocking the system after first magnet 102 and second magnet 104 have repelled away from each other. Additionally or alternatively, first magnet 102 and second magnet 104 can be moved close together by modulating the magnetic properties of the space and/or materials located between first and second magnets 102, 104 by, for example, chemical modulating means, electrochemical modulating means, thermal modulating means, or combinations thereof. For example, ferromagnetic element 106 can comprise a material such as gadolinium, which has different magnetic properties at different temperatures.

As shown in FIG. 1, energy conversion device 100 can further comprise a conductive cable 150 attached to ferromagnetic element 106, which can facilitate collection of eddy currents produced in ferromagnetic element 106. In some embodiments, cable 150 can include diode 152, which forces the collected current to flow in a single direction. Cable 150 can be connected to the output of the system, actuation device 110 or a combination thereof.

Energy conversion device 100 can comprise a mechanical element 108 which can be connected to first magnet 102, second magnet 104, or both, by magnet supports 114, 116 such that movement of the first and/or second magnets can actuate mechanical element 108. In other words, mechanical element 108 is connected to the magnets such that the repulsive and/or attractive properties of the magnets can be converted into mechanical work and/or electricity. In some embodiments, mechanical element 108 can comprise, for example, a rack and pinion system having a first rack 118, a second rack 120 and a pinion 122 located between and connected to first rack 118 and second rack 120. Suitable commercially available rack and pinion systems are manufactured by, for example, Andantex (Wanamassa, N.J.) and by Argo Engineers (Rajasthan, India). One of ordinary skill in the art will recognize that embodiments with additional mechanical elements connected to the first and second magnets are contemplated and are within the scope of the present disclosure.

As shown in FIG. 1, first and second racks 118, 120 can be provided with structure such as protrusions that are adapted to engage corresponding structure located on pinion 122 to facilitate coupling between racks 118, 120 and pinion 122. Thus, movement of first magnet 102 and second magnet 104 can actuate first rack 118 and second rack 120, which can rotate pinion 122. Generally, pinion 122 can be connected to another mechanical structure by a rod, lever or the like, such that rotation of pinion 122 can be used to power another mechanical device and/or power generation apparatus. Additional first and second magnets can be added to the system shown in FIG. 1, for example, by stacking or the like, in order to overcome friction.

In some embodiments, first magnet 102 can comprise bracket 107 and second magnet 104 can comprise bracket 109, which can prevent magnets 102, 104 from contacting ferromagnetic element 106 when first magnet 102 and second magnet 104 are positioned near one another. Thus, when first magnet 102 and second magnet 104 are positioned proximate one another, bracket 107 can contact bracket 109 and prevent first magnet 102 and second magnet 104 from contacting ferromagnetic element 106.

In an alternate embodiment, FIG. 1A is a schematic diagram of an embodiment of an energy conversion apparatus comprising a first ferromagnetic element 102, a second ferromagnetic element 104 and an externally powered temperature control device 190 to selectively alter the temperature of the ferromagnetic elements to change the Curie temperature of the ferromagnetic elements. The temperature control device 190 has a cooling water supply 182 containing cooling water 180 that can be distributed via cooling lines 184 through spray systems 186 to discharge cooling spray 188 on the ferromagnetic elements 102, 104, thus changing the Curie temperature of the ferromagnetic elements and the magnetic properties of the elements. The resulting change in magnetic properties with thus cause movement of the ferromagnetic elements 102, 104.

Figure 2A:
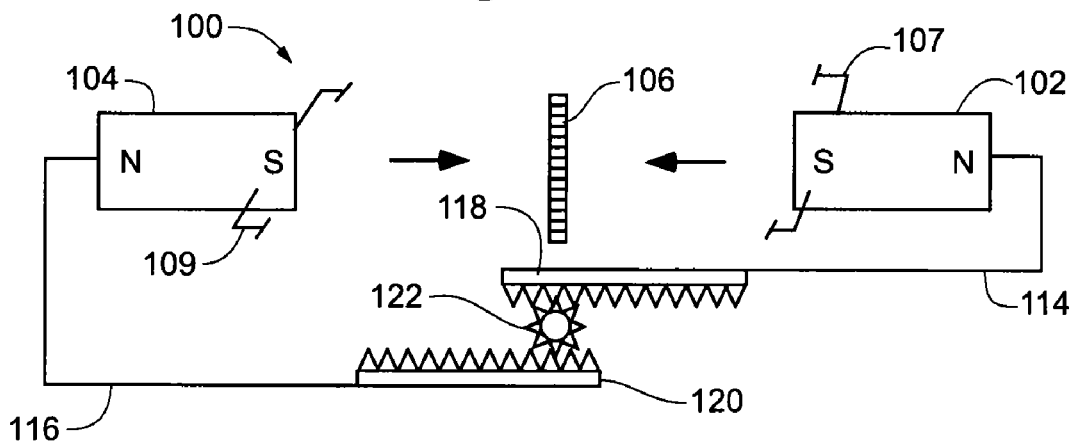
FIGS. 2a-2c are schematic diagrams of the apparatus of FIG. 1 showing the first magnet and the second magnet moving towards the ferromagnetic element.
Figure 2B:
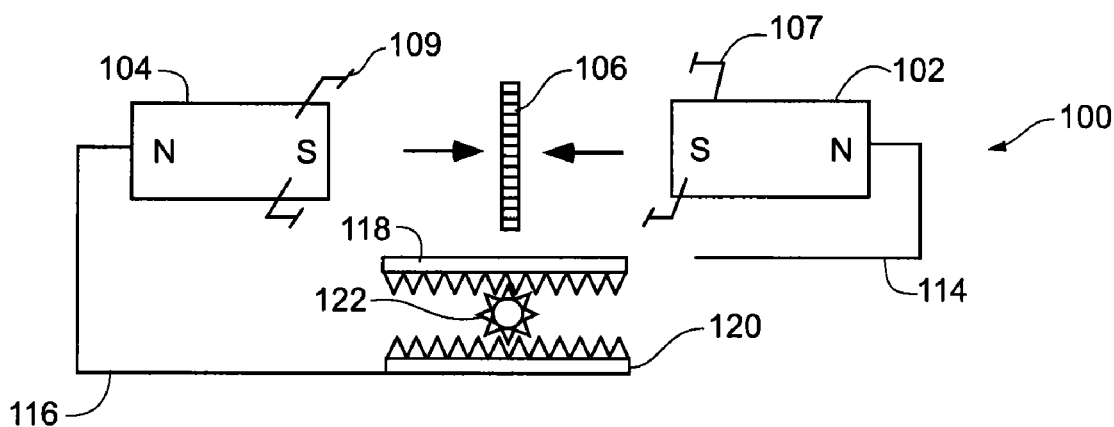
Figure 2C:
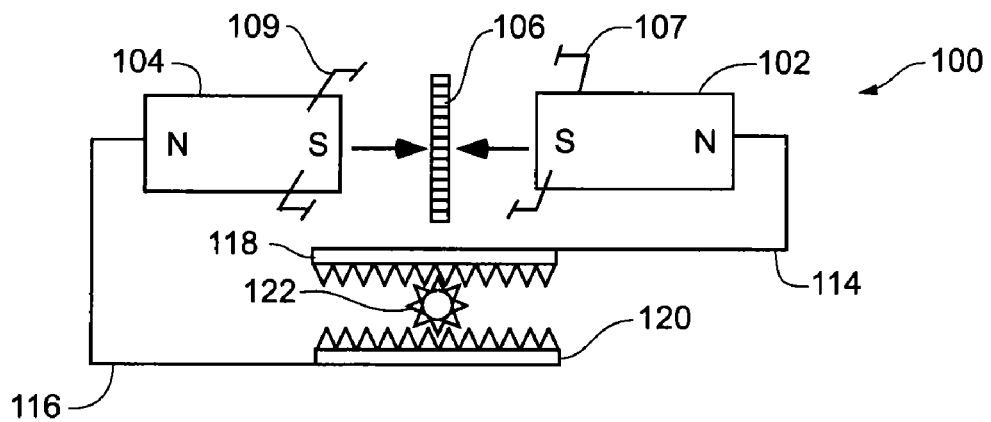

Referring to FIGS. 1, 1a, 2a, 2b and 2c, during operation of energy conversion device 100, ferromagnetic element 106 can be interposed between first magnet 102 and second magnet 104 by, for example, gravity. Once ferromagnetic element 106 is positioned between first magnet 102 and second magnet 104, the repulsive magnetic fields generated by the similar poles (i.e., the south poles both magnets) of first magnet 102 and second magnet 104 can be reduced by element 106, which can facilitate moving first magnet 102 to a position near second magnet 104. Additionally, as shown in FIGS. 2a, 2b and 2c, both first magnet 102 and second magnet 104 can be attracted to ferromagnetic element 106, which results in first magnet 102 and second magnet 104 moving towards ferromagnetic element 106. As first magnet 102 and second magnet 104 move towards ferromagnetic element 106, first rack 118 and second rack 120 can be actuated which can rotate pinion 122. Preferably, the energy devices are designed such that the magnets move at substantially the same rate and maintain substantially the same distance away from the ferromagnetic element during movement.

Once first magnet 102 and second magnet 104 are located near ferromagnetic element 106, actuation device 110 can actuate cable 112 and move ferromagnetic element 106 such that element 106 is not positioned between first magnet 102 and second magnet 104. Removing ferromagnetic element 106 from between first magnet 102 and second magnet 104 can position the similar poles of first magnet 102 and second magnet 104 proximate one another, which can cause first magnet 102 and second magnet 104 to repel away from each other. As magnets 102 and 104 simultaneously move away from each other, racks 118, 120 can be actuated which can rotate pinion 122. Ferromagnetic element 106 can then be interposed between first magnet 102 and second magnet 104 by, for example, gravity and the above process can be repeated.

In some embodiments, mechanical element 108 can be connected to actuation device 110 such that a portion or all of the energy required to selectively interpose ferromagnetic element 106 is provided by energy conversion device 100. Thus, in the embodiments where all of the energy required to selectively interpose ferromagnetic element 106 is provided by mechanical element 108, the system can continue to run, once started, until the magnetic properties of first magnet 102 and second magnet 104 are not sufficient to cause movement of the magnets. Once this occurs, first and second magnets 102, 104 can be replaced in order to keep the system operating.

Referring to FIGS. 3-5, an embodiment of an energy conversion device 200 is shown comprising a plurality of first magnets 202, 203, a plurality of second magnets 204, 205, and plurality of ferromagnetic elements 206, 207 that can be selectively interposed between the plurality of first magnets 202, 203 and the plurality second magnets 204, 205. Although FIGS. 3-5 shows an embodiment of an energy conversion device having two first magnets and two second magnets, one of ordinary skill in the art will recognize that embodiments having additional numbers of first and second magnets are contemplated and are within the scope of the present disclosure.

As shown in FIGS. 3-5, the plurality of first magnets 202, 203 and second magnets 204, 205 can be aligned such that the plurality of first magnets can repel the plurality of second magnets. By orienting the plurality of first and second magnets such that the similar poles of adjacent magnets are can be positioned next to each other, the repulsive force of the magnets can be used to generate mechanical work. Generally, each of the plurality of first magnets 202, 203 can be associated with at least one of the plurality of second magnets 204, 205 such that the similar poles of the associated magnets can be positioned adjacent one another. As shown in FIGS. 3-5, first magnet 202 can be associated with second magnet 204, while first magnet 203 can be associated with second magnet 205. Additionally, brackets 211, 213 can be provided on the plurality of first and second magnets to prevent the plurality of first and second magnets from contacting the plurality of ferromagnetic elements. Thus, brackets 211, 213 can contact each other when associated first and second magnets are positioned proximate one another to provide a stop, which can prevent the magnets from contacting the ferromagnetic element and can reduce the friction of the system.

As described above, energy conversion device 200 can comprise a plurality of ferromagnetic elements 206, 207 which can facilitate movement of a first magnet towards the similar pole of an associated second magnet. Generally, the first and second magnets can be attracted to the ferromagnetic element, and thus interposing the ferromagnetic element between the associated first and second magnets can cause the associated first and second magnets to move towards the ferromagnetic element. In some embodiments, a ferromagnetic element can be provided for each pair of associated first and second magnets employed in a particular energy device. In one embodiment, the plurality of ferromagnetic elements 206, 207 can be connected to one or more actuation devices 210 via cables 212, which facilitates selectively interposing the plurality of ferromagnetic elements 206, 207 in between associated pairs of first and second magnets. As described above, actuation devices 210 can be, for example, motors, counter-balance systems or combinations thereof. In embodiments where the actuation devices 210 comprise a motor(s), the motor(s) can be in communication with, and controlled by, a CPU programmed to selectively interpose the plurality of ferromagnetic elements 206, 207 at desired time intervals.

For example, the CPU can be programmed to interpose ferromagnetic element 207 between first and second magnets 202, 204 while simultaneously removing ferromagnetic element 206 from in between first and second magnets 203, 205. In some embodiments, a pulley wheel system 215 can be used to support and guide cables 212.

Generally, a mechanical element can be connected to a portion of the plurality first magnets, portion of the plurality second magnets, or both, such that movement of the plurality first and/or second magnets can actuate the mechanical element and provide mechanical work. As described above, mechanical element 208 facilitates conversion of the repulsive and/or attractive forces of the magnets into mechanical work. In one embodiment, as described above, mechanical element 208 can comprise a rack and pinion system. As shown in FIGS. 3-5, the plurality of first magnets 202 can be connected to rack 218 by magnet supports 214, and the plurality of second magnets 204 can be connected to rack 220 by magnet supports 216. In general, the magnet supports of the present disclosure can be composed of any diamagnetic material suitable for use in energy conversion devices including, for example, metals, plastics, and combinations thereof. In some embodiments, mechanical element 208 can be connected to another mechanical device and/or an energy generation apparatus by, for example, connection rod 224, which can be connected to pinion 222. In some embodiments, mechanical element 208 can be connected to actuation device (s) 210 such that a portion or all of the energy required to selectively interpose ferromagnetic elements 206, 207 can be provided by energy conversion device 200.

Referring to FIGS. 4-5, during operation of energy conversion device 200, ferromagnetic element 207 can be interposed between first magnet 202 and second magnet 204, which facilitates the movement of first magnet 202 and second magnet 204 towards ferromagnetic element 207. Additionally, as shown in FIG. 4, ferromagnetic element 206 can be positioned, for example, above first magnet 203 and second magnet 205, which can cause first magnet 203 and second magnet 205 to repel away from each other, and thus move magnet 202 towards ferromagnetic element 207. The movement of magnets 203, 205 away from each other, along with the movement of magnets 202, 204 towards ferromagnetic element 207, can actuate first rack 218 and second rack 220, which can rotate pinion 222.

Once magnets 202, 204 are positioned near ferromagnetic element 207, ferromagnetic element 206 can be interposed between magnets 203, 205 and ferromagnetic element 207 can be retracted to a position, for example, above magnets 202, 204. As shown in FIG. 5, magnets 203, 205 can be attracted towards ferromagnetic element 206, while magnets 202, 204 can repel from each other. The repulsion of magnets 202, 204, along with the attraction of magnets 203, 205 towards ferromagnetic element 206, can move magnets 203, 205 towards ferromagnetic element 206, and actuate first rack 218 and second rack 220. The above process can then be repeated by interposing ferromagnetic element 207 between magnets 202, 204, and removing ferromagnetic element 206 from in between magnets 203, 205.

Referring to FIG. 6, an additional embodiment of an energy conversion device 300 is shown comprising two of the devices 200 shown in FIGS. 2-4 connected to form a unitary device. In these embodiments, energy conversion devices 200 can be coupled together by a mechanical coupling element 302, which can be, for example, a chain or the like. In some embodiments, mechanical coupling element 302 can be connected to each mechanical element such that the movement of the mechanical elements can be synchronized, which facilitates coupling the energy output of multiple devices 200. Although FIG. 6 shows an embodiment where two energy conversion devices are coupled to form a unitary device, one of ordinary skill in the art will recognize that embodiments with additional numbers of energy conversion devices connected together are contemplated and are within the scope of the present disclosure.

In some embodiments, ferromagnetic elements 206, 207 can be connected to support bar 304 which allows the ferromagnetic elements to be selectively interposed between the first magnets 202, 203 and the second magnets 204, 205 of both energy conversion devices 200. Generally, support bar 304 can be connected to a motor or the like to actuate support bar 304 and facilitate interposing the ferromagnetic elements between the magnets. In one embodiment, the motor can be in communication with and controlled by a CPU of a computer system that can be programmed to selectively interpose ferromagnetic elements 206, 207 between first magnets 202, 203 and second magnets 204, 205 at desired time intervals.

As described above, in some embodiments the energy conversion devices of the present disclosure can comprise an actuation device having a counter-balance system, a motor or a combination thereof. FIG. 7 shows one embodiment of an actuation device 500 that can be connected to ferromagnetic element 502 via cable 504. In some embodiments, actuation device 500 can comprise a counter-balance system having a plurality of weights 504, 506 housed in a plurality of weight holders 508, 510. As shown in FIG. 7, weights 504 can be connected by bar 512, while weights 506 can be connected by bar 514. Connecting weights 504, 506 with bars 512, 514 facilitates coupling the weights with connection element 516, which can be provided on cable 504. Generally, connection element 516 can be a hook or the like suitable for connecting with and lifting bars 512, 514. Additionally, in some embodiments, motor 517 can be connected to cable 504 to facilitate raising and/or lowering ferromagnetic element 502.

During operation, gravity can pull ferromagnetic element 502 down towards magnets 518, 520, which can cause connection element 516 to move upwards and engage bars 512, 514. As shown in FIG. 7, magnets 518, 520 can be connected to a mechanical element 530 by magnet supports 532, 534. Mechanical element 530 can be, for example, a rack and pinion system as described above. Once connection element 516 engages bars 512, 514, weights 506, 504 can be lifted out of weight holders 508, 510 and act as counter-balance to ferromagnetic element 502 such that the downward movement of ferromagnetic element 502 can be slowed down and/or stopped by the counter-balance weight. One of ordinary skill in the art can empirically adjust the counter-balance system to slow and/or stop the downward motion of ferromagnetic element 502 at desired locations such as, for example, in between magnets 518, 520. In some embodiments, motor 517 can actuate cable 504 to pull ferromagnetic element 502 upwards, which can lower connection element 516 and return weights 504, 506 to weight holders 508, 510.

The magnets of the present disclosure can be any magnets suitable for use in energy device applications including, for example, ceramic magnets, ferrite magnets ($BaFe_2O_3$ or $SrFe_2O_3$), samarium cobalt magnets ($SmCo_5$ or $Sm_2Co_{17}$), neodymium iron boron (NIB) magnets ($Nd_2Fe_{14}B$), Alnico magnets, and combinations thereof. The ferromagnetic materials of the present disclosure can be any ferromagnetic material suitable for use in energy conversion application. Suitable ferromagnetic materials include, for example, iron, nickel, cobalt, gadolinium, various alloys of these metals, other chemicals having suitable ferromagnetic properties, and combinations thereof.

The embodiments above are intended to be illustrative and not limiting. Additional embodiments are within the claims. Although the present invention has been described with reference to particular embodiments, workers skilled in the art will recognize that changes may be made in form and detail without departing from the spirit and scope of the invention.

The invention claimed is:

1. An apparatus for producing mechanical work comprising:
   a plurality of first magnets having a north pole and a south pole;
   a plurality of second magnets having a north pole and a south pole, wherein each of the plurality of first magnets is associated with at least one of the plurality of second magnets such that a pole of each of the plurality of first magnets can be positioned proximate a similar pole of the associated second magnet;
   a mechanical element coupled to at least a portion of the plurality of first magnets by one or more magnet supports such that movement of at least a portion of the plurality of first magnets actuates the mechanical element;
   a plurality of ferromagnetic elements interposed equidistantly between the plurality of first magnets and the plurality of second magnets;
   an externally powered temperature control device to selectively alter the temperature of the plurality of ferromagnetic elements to change the Curie temperature of the ferromagnetic elements, thus causing the ferromagnetic elements to temporarily lose their ferromagnetic property;
   wherein the movement of the mechanical element is used to generate electrical energy, said energy then being used to drive the externally powered temperature control devices.

2. The apparatus of claim 1, wherein at least a portion of the plurality of second magnets are coupled to the mechanical element by one or more magnet supports such that movement of the plurality of second magnets actuates the mechanical element.

3. The apparatus of claim 1, wherein the mechanical element comprises a rack and pinion system having a first rack, a second rack, and a pinion located between the first rack and the second rack, wherein the plurality of first magnets is connected to the first rack and the plurality of second magnets is connected to the second rack.

4. The apparatus of claim 3, wherein a rod is connected to the rack and pinion system to facilitate connection of the rack and pinion system with another mechanical device.

5. The apparatus of claim 1, further comprising a CPU in communication with the externally powered temperature control device to control the function of the externally powered temperature control device.

6. The apparatus of claim 1, wherein the mechanical element is connected to the externally powered temperature control device such that a portion of the energy required to selectively alter the temperature of the ferromagnetic elements is provided by the mechanical element.

7. The apparatus of claim 1, wherein the ferromagnetic elements comprise iron, nickel, cobalt, gadolinium or combinations thereof 8. The apparatus of claim 1, wherein temperature control device discharges a liquid onto the ferromagnetic elements.

9. An apparatus for producing mechanical work comprising:
   a first magnet having a north pole and a south pole;

a second magnet having a north pole and a south pole, wherein the first magnet and the second magnet are aligned such that the similar poles of the first and second magnet are adjacent each other;

a mechanical element connected to the first magnet by a first magnet support such that movement of the first magnet actuates the mechanical element;

a ferromagnetic element interposed equidistantly between the first magnet and the second magnet;

an externally powered temperature control device to selectively alter the temperature of the ferromagnetic element to change the Curie temperature of the ferromagnetic element, thus causing the ferromagnetic element to temporarily lose its ferromagnetic property;

wherein the movement of the mechanical element is used to generate electrical energy, said energy then being used to drive the externally powered temperature control device.

10. The apparatus of claim 9, wherein the second magnet is connected to the mechanical element by a second magnet support such that movement of the second magnet actuates the mechanical element.

11. The apparatus of claim 10, wherein the first magnet and the second magnet are moving at the same time.

12. The apparatus of claim 10, wherein the mechanical element comprises a rack and pinion system having a first rack, a second rack, and a pinion located between the first rack and the second rack, wherein the first rack is connected to the first magnet by the first magnet support and the second rack is connected to the second magnet by the second magnet support.

13. The apparatus of claim 12, wherein a rod is connected to the rack and pinion to facilitate connection of the rack and pinion with another mechanical device.

14. The apparatus of claim 9, wherein the first magnet is selected from the group consisting of ceramic magnets, ferrite magnets, samarium cobalt magnets, neodymium iron boron magnets (NIB), Alnico magnets and combinations thereof.

15. The apparatus of claim 9, wherein the second magnet is selected from the group consisting of ceramic magnets, ferrite magnets, samarium cobalt magnets, neodymium iron boron magnets (NIB), Alnico magnets and combinations thereof.

16. The apparatus of claim 9, wherein the ferromagnetic element comprises iron, nickel, cobalt, gadolinium or combinations thereof.

17. The apparatus of claim 9 further comprising a conductive cable attached to the ferromagnetic element to collect eddy currents.

* * * * *